US009203041B2

(12) United States Patent
Han et al.

(10) Patent No.: US 9,203,041 B2
(45) Date of Patent: Dec. 1, 2015

(54) CARBON NANOTUBE TRANSISTOR HAVING EXTENDED CONTACTS

(71) Applicant: International Business Machines Corporation, Armonk, NY (US)

(72) Inventors: Shu-Jen Han, Cortlandt Manor, NY (US); Wilfried E. Haensch, Somers, NY (US); James B. Hannon, Lake Lincolndale, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/169,340

(22) Filed: Jan. 31, 2014

(65) Prior Publication Data
US 2015/0221884 A1 Aug. 6, 2015

(51) Int. Cl.
*H01L 21/00* (2006.01)
*H01L 51/00* (2006.01)
*H01L 51/05* (2006.01)
*B82Y 10/00* (2011.01)

(52) U.S. Cl.
CPC .......... *H01L 51/0545* (2013.01); *B82Y 10/00* (2013.01); *H01L 51/0002* (2013.01); *H01L 51/0558* (2013.01); *H01L 51/0048* (2013.01)

(58) Field of Classification Search
CPC ........ B82Y 40/00; B82Y 10/00; B82Y 99/00; H01L 29/0669; H01L 29/0673; H01L 29/0676; H01L 51/0048; H01L 51/0545; H01L 51/0002; H01L 51/0558
See application file for complete search history.

(56) References Cited

U.S. PATENT DOCUMENTS

| | | | |
|---|---|---|---|
| 4,952,990 A | 8/1990 | Gruning | |
| 5,773,331 A | 6/1998 | Solomon et al. | |
| 7,180,107 B2* | 2/2007 | Appenzeller et al. | 257/288 |
| 7,755,115 B2* | 7/2010 | Awano | 257/288 |
| 7,835,170 B2 | 11/2010 | Bertin et al. | |
| 7,838,943 B2 | 11/2010 | Furukawa et al. | |
| 8,338,897 B2* | 12/2012 | Kim et al. | 257/417 |
| 8,513,099 B2 | 8/2013 | Chang et al. | |
| 8,785,911 B2* | 7/2014 | Chen et al. | 257/29 |
| 2004/0245527 A1 | 12/2004 | Tsukagoshi et al. | |
| 2005/0212014 A1* | 9/2005 | Horibe et al. | 257/213 |
| 2005/0274992 A1* | 12/2005 | Appenzeller et al. | 257/288 |
| 2008/0293228 A1 | 11/2008 | Kalburge | |

(Continued)

OTHER PUBLICATIONS

Chai et al., "Low-resistance electrical contact to carbon nanotubes with graphitic interfacial layer", IEEE Transactions on Electron Devices, vol. 59, No. 1, 2012, pp. 12-19.

(Continued)

*Primary Examiner* — Nikolay Yushin
(74) *Attorney, Agent, or Firm* — Cantor Colburn LLP; Vazken Alexanian

(57) ABSTRACT

A semiconductor device includes a substrate that extends along a first direction to define a length and second direction perpendicular to the first direction to define a height. The substrate includes a dielectric layer and at least one gate stack formed on the dielectric layer. A source contact is formed adjacent to a first side of the gate stack and a drain contact formed adjacent to an opposing second side of the gate stack. A carbon nanotube is formed on the source contact and the drain contact. A first portion of the nanotube forms a source. A second portion forms a drain. A third portion is interposed between the source and drain to define a gate channel that extends along the first direction. The source and the drain extend along the second direction and have a greater length than the gate channel.

17 Claims, 22 Drawing Sheets

(56) References Cited

U.S. PATENT DOCUMENTS

| | | | |
|---|---|---|---|
| 2009/0121298 A1 | 5/2009 | Furukawa et al. | |
| 2010/0038628 A1* | 2/2010 | Afzali-Ardakani et al. | 257/24 |
| 2010/0052034 A1 | 3/2010 | Cheng et al. | |
| 2011/0031566 A1* | 2/2011 | Kim et al. | 257/419 |
| 2012/0138902 A1 | 6/2012 | Hunt et al. | |
| 2012/0211807 A1 | 8/2012 | Yu et al. | |
| 2012/0326126 A1* | 12/2012 | Chen et al. | 257/29 |
| 2012/0326127 A1 | 12/2012 | Chang et al. | |
| 2013/0146953 A1 | 6/2013 | Cheng et al. | |

OTHER PUBLICATIONS

Franklin et al., "Length scaling of carbon nanotube transistors", Nature Nanotechnology, vol. 5, No. 12, 2010, pp. 858-862.
Park et al., "High-density integration of carbon nanotubes via chemical self-assembly", Nature Nanotechnology, vol. 7, 2012, pp. 787-791.
International Search Report and Written Opinion; International Application No. PCT/US2014/068526; International Filing Date: Dec. 4, 2014; Date of Mailing: Mar. 18, 2015; 9 pages.

* cited by examiner

CARBON NANOTUBE TRANSISTOR HAVING EXTENDED CONTACTS

BACKGROUND

The present invention relates to semiconductor devices, and more specifically, to carbon nanotube transistors.

Carbon nanotube field-effect transistors (CNTFETs) are strong candidates to replace or supplement traditional silicon transistor technology. CNTFET performance may be significantly affected by the electrical resistance of the contacts. Therefore, the overall contact area between source/drain electrodes and CNT affects the performance of the CNTFET.

In order to avoid high contact resistance limiting the overall transistor performance, conventional CNTFETs requires a large length ($L_c$) of the metal contacts in a direction parallel to the gate length ($L_G$) (i.e., in the X-axis direction), as illustrated in FIG. 1. Recent device scaling trends continue to demand a reduction in the pitch of semiconductor device, which is defined as the distance between the center of the gates of two adjacent devices. When fabricating multi-gate CNTFETs, a minimum distance ($d_C$) between adjacent metal contacts is required to prevent shorting of adjacent semiconductor devices. Therefore, a device structure that has an increased length of the metal contacts without increasing the overall pitch of the semiconductor is desirable in order to ensure a suitable $d_C$.

SUMMARY

According to at least one embodiment, a semiconductor device comprises a substrate that extends along a first direction to define a length and second direction perpendicular to the first direction to define a height. The substrate includes a dielectric layer and at least one gate stack formed on the dielectric layer. A source contact is formed adjacent to a first side of the gate stack and a drain contact formed adjacent to an opposing second side of the gate stack. A carbon nanotube is formed on the source contact and the drain contact. The carbon nanotube includes a first portion, a second portion, and a third portion. The first portion contacts the source contact to form a source. The second portion contacts the drain contact to form a drain. The third portion is interposed between the first and second portions to form a gate channel that extends along the first direction. The source and the drain each extend along the second direction and have a greater length than the length of the gate channel.

According to another embodiment, a method of fabricating a semiconductor device comprises forming at least one gate stack on a dielectric layer of a substrate. The substrate extends along a first direction to define a length and second direction perpendicular to the first direction to define a height. The method further includes forming a functionalized dielectric layer on the gate stack. The method further includes forming a source contact on a first portion of the functionalized dielectric layer located at a first side of the gate stack and forming a drain contact on a second portion of the functionalized dielectric layer located at an opposing second side of the gate stack. The method further includes forming a carbon nanotube on the source contact and the drain contact to define a source and a drain, respectively. A gate channel extends along the first direction to define a gate length and is interposed between the source and the drain. The method further includes electrostatically coupling at least one portion of the carbon nanotube on the functionalized dielectric layer such that the source and the drain extend in the second direction perpendicular to a gate length.

Additional features are realized through the techniques of the present invention. Other embodiments are described in detail herein and are considered a part of the claimed invention. For a better understanding of the invention and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features are apparent from the following detailed description taken in conjunction with the accompanying drawings in which:

DETAILED DESCRIPTION

Figure 1:
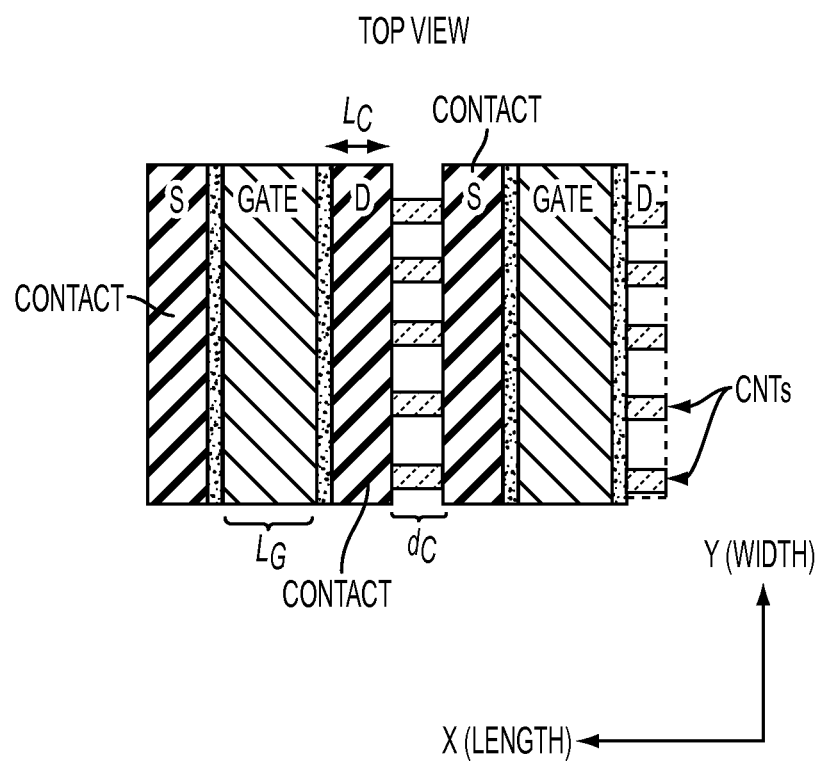
FIG. 1 illustrates a top view of a conventional top-gated carbon nanotube FET.
Figure 2:
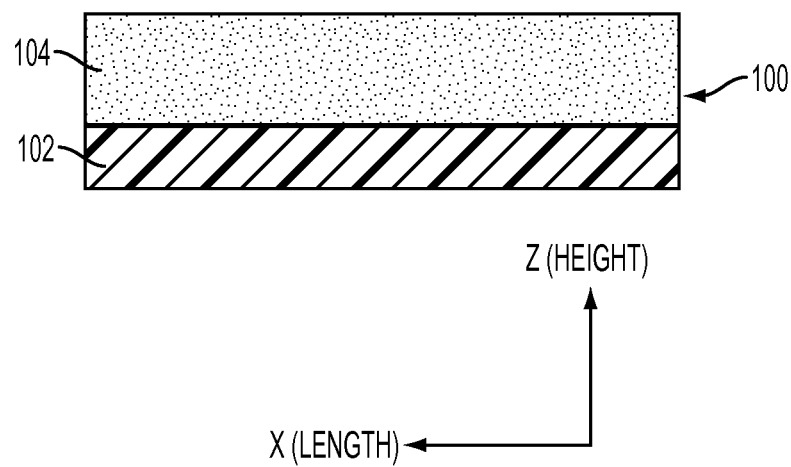
FIG. 2 is a cross-sectional view of a starting substrate including a dielectric layer formed on an upper surface of a bulk layer.

Referring now to FIG. 2, a cross-sectional view of a starting substrate 100 is illustrated. The starting substrate 100 extends along an X-axis to define a length and a Z-axis to define a height. The starting substrate 100 includes a bulk layer 102 and a dielectric layer 104 formed on an upper surface of the bulk layer 102. The bulk layer 102 may be formed from a semiconductor material including, for example, silicon (Si). The dielectric layer 104 may be formed from various dielectric materials including, but not limited to silicon nitride ($Si_3N_4$), and is configured to provide electrical isolation. Various methods may be used to deposit the dielectric layer including, but not limited to, chemical vapor deposition (CVD).

Figure 3:
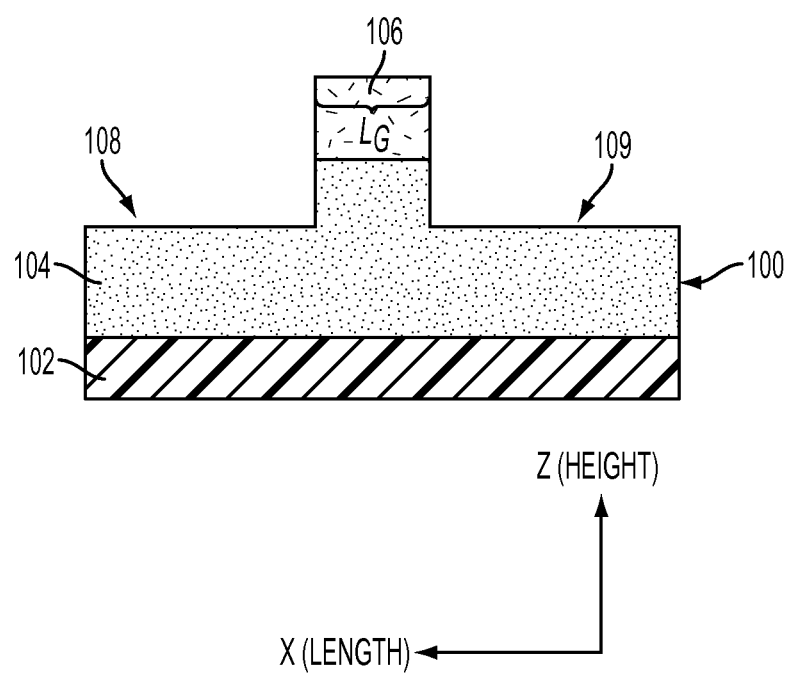
FIG. 3 illustrates the substrate of FIG. 2 after recessing portions of the dielectric layer to form source/drain regions and forming a gate stack on an upper surface the dielectric layer.

Turning to FIG. 3, the dielectric layer 104 is recessed and a gate stack 106 is formed on the dielectric layer 104 using conventional deposition and etching processes including, but not limited to photolithography and reactive ion etching (RIE) processes. The dielectric layer 104 is recessed to form a source region 108 and a drain region 109. The depth at which the dielectric layer 104 is recessed may vary according to the device application. The gate stack 106 has a gate length ($L_G$) and is formed on an upper surface of the dielectric layer 104 located between the S/D regions 108, 109. The gate stack 106 may be formed from various materials including, but not limited to, tantalum (Ta), niobium (Nb), gold (Au), aluminum (Al), and polysilicon (PC).

Figure 4:
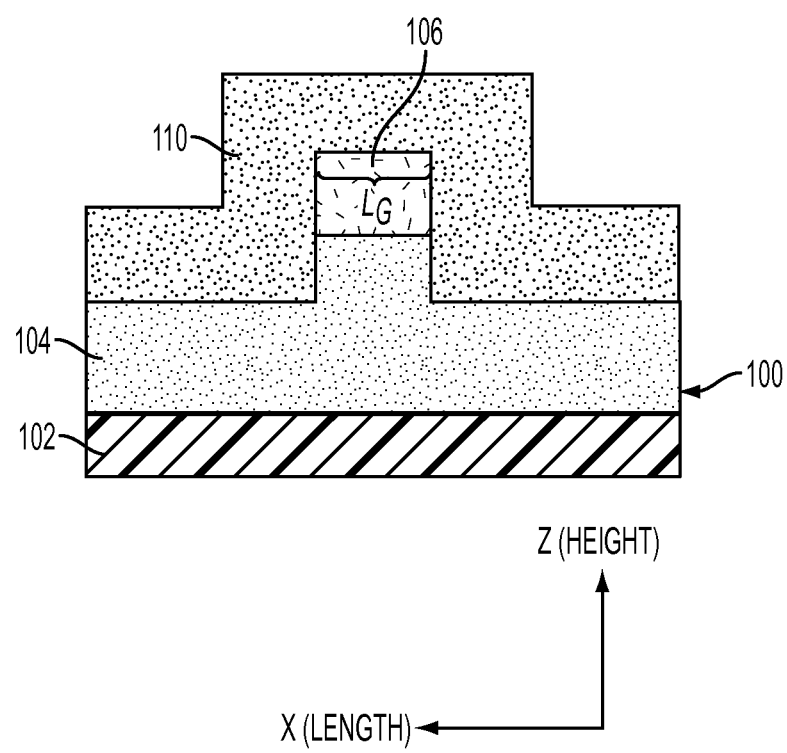
FIG. 4 illustrates the substrate of FIG. 3 following deposition of a spacer dielectric layer on an upper surface of the etched dielectric layer to cover the gate stack.

Referring now to FIG. 4, a dielectric layer 110 is deposited on the substrate 100 to cover the etched dielectric layer 104 and gate stack 106. Various methods for depositing the dielectric layer 110 may be performed including, for example, CVD. The dielectric layer 110 may be formed from a low-dielectric (i.e., low-k) material. The low-k material may include, but is not limited to, polymer-derived amorphous ceramic (SiBCN).

Figure 5:
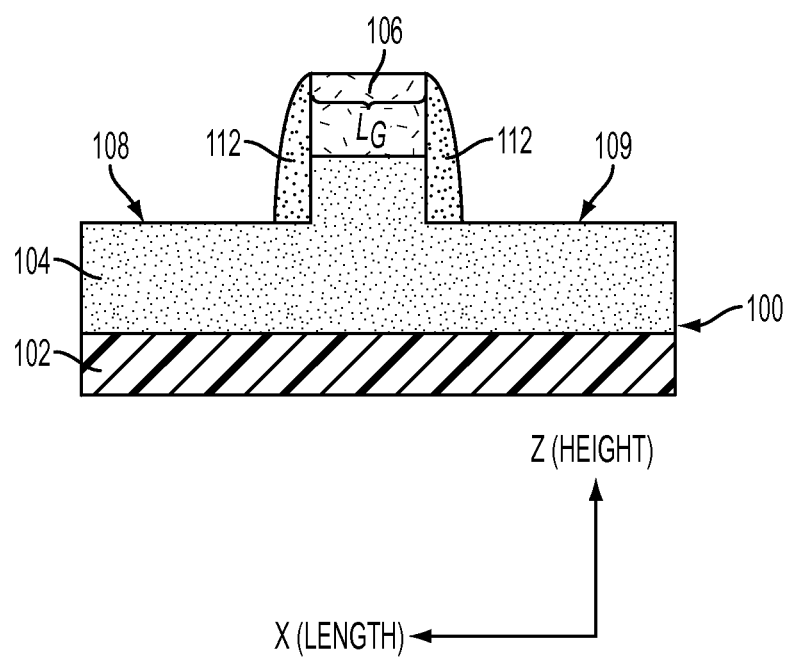
FIG. 5 illustrates the substrate of FIG. 4 following etching of the spacer dielectric layer to form a spacers along the sidewalls of the gate stack.

Referring now to FIG. 5, the dielectric layer 110 is etched according to conventional etching processes to expose an upper surface of the gate stack 106. The etching process also forms spacers 112 on the sidewalls of the gate stack 106 and the sidewalls of the etched dielectric layer 104.

Figure 6:
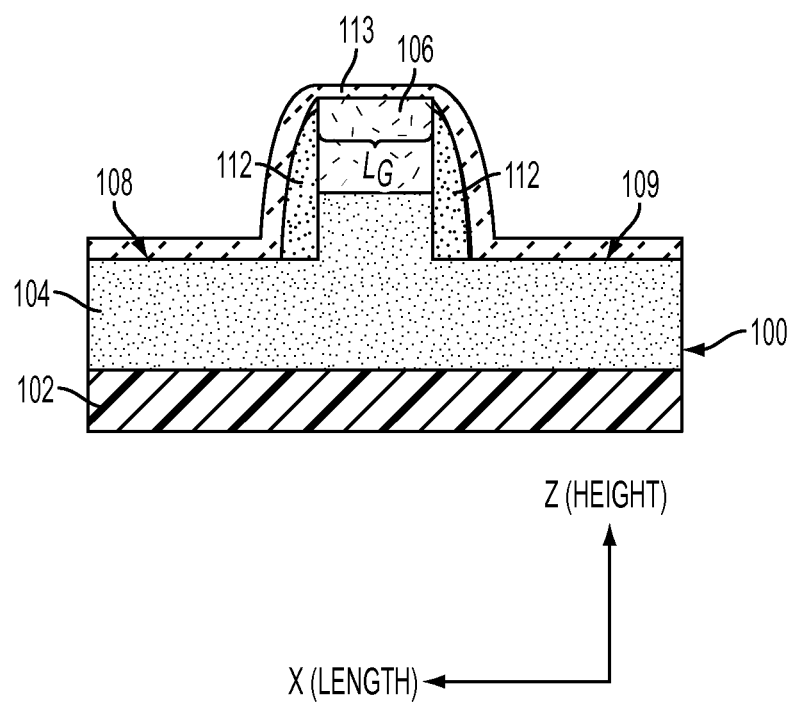
FIG. 6 illustrates the substrate of FIG. 5 following deposition of a conformal functionalized dielectric layer that covers an upper surface of the etched dielectric layer, the sidewalls of the spacers, and an upper surface of the gate stack.

Turning to FIG. 6, a conformal functionalized dielectric layer 113 is formed on the substrate 100 using various deposition processes including, but not limited to, CVD and atomic layer deposition (ALD). The functionalized dielectric layer 113 covers an upper surface of the etched dielectric layer 104, the sidewalls of the spacers 112, and an upper surface of the gate stack 106. The functionalized dielectric layer 113 may be formed from various materials including, but not limited to, hafnium oxide ($HfO_2$), aluminum oxide ($Al_2O_3$), and silicon nitride ($Si_3N_4$).

Figure 7:
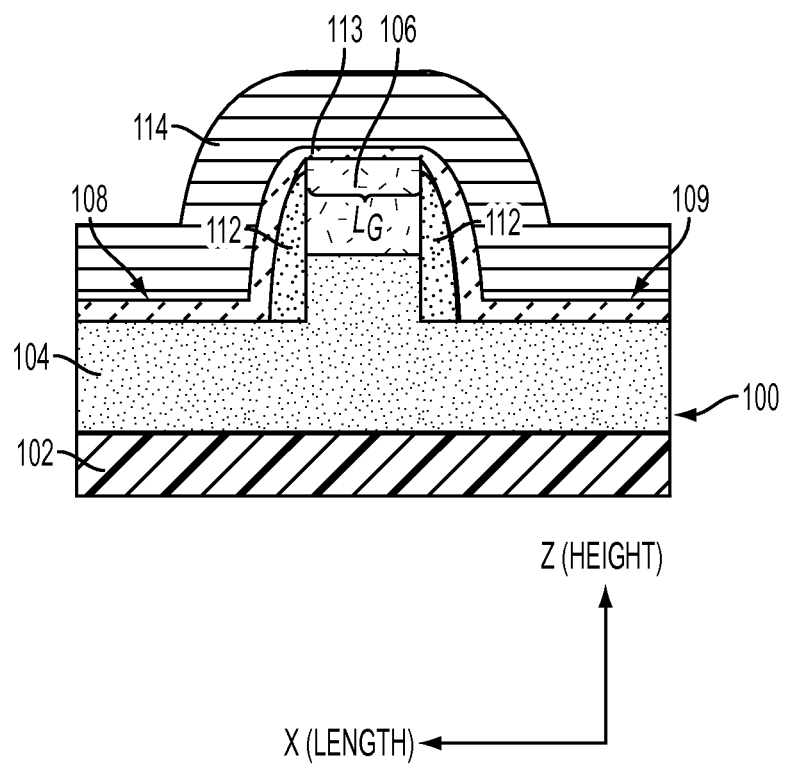
FIG. 7 illustrates the substrate of FIG. 6 following deposition of a metal contact layer that covers the gate stack and is formed against an outer surface of the functionalized dielectric layer.
Figure 8:
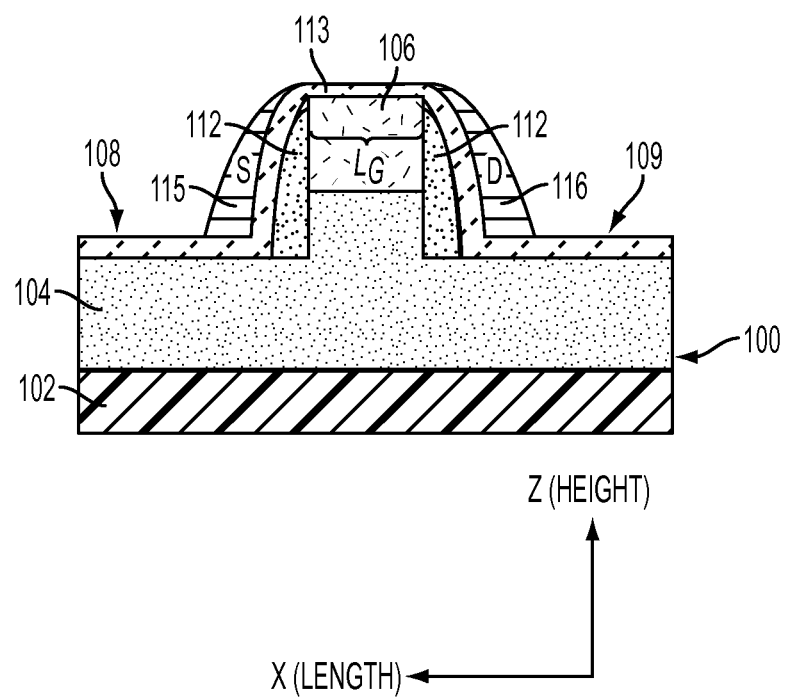
FIG. 8 illustrates the substrate of FIG. 7 after etching the metal contact layer to form metal contacts that extend vertically from the dielectric layer of the substrate toward an upper portion of the gate stack.

Turning to FIG. 7, a metal contact layer 114 is deposited on the substrate 100. The metal contact block layer 114 covers the metal gate 106 and is formed over an outer surface of the functionalized dielectric layer 113. The metal contact layer 114 may be formed from various materials including, but not limited to, palladium (Pd), scandium (Sc) and Erbium (Er). As illustrated in FIG. 8, the metal contact layer 114 is etched to form a source metal contact 115 and a drain metal contact 116. Various etching process may be used to form the metal contacts 115, 116 including, but not limited to, RIE. The source and drain metal contacts 115, 116 extend perpendicular to the length of the gate stack. 106 For example, the source and drain metal contacts 115, 116 extend vertically from a first contact end that contacts a portion of the functionalized dielectric layer 113 formed on the dielectric layer 104 to a second contact end that contacts a portion of the functionalized dielectric layer 113 formed adjacent an upper portion of the gate stack 106. In at least one exemplary embodiment, the second contact end extends beyond the upper surface of the gate stack 106. According to at least one embodiment, the metal contacts 115, 116 extend a distance along the Z-axis (e.g., a contact height) that is greater than a distance of the gate stack 106 extending along the Z-axis (e.g., a gate height). The metal contacts 115, 116 may have a height ranging, for example, from approximately 10 nanometers (nm) to approximately 100 nm. According to at least one exemplary embodiment, the height of the metal contacts 115, 116 extending in a direction of Z-axis is greater than the length of the metal contacts extending in a direction of the X-axis.

Figure 9:
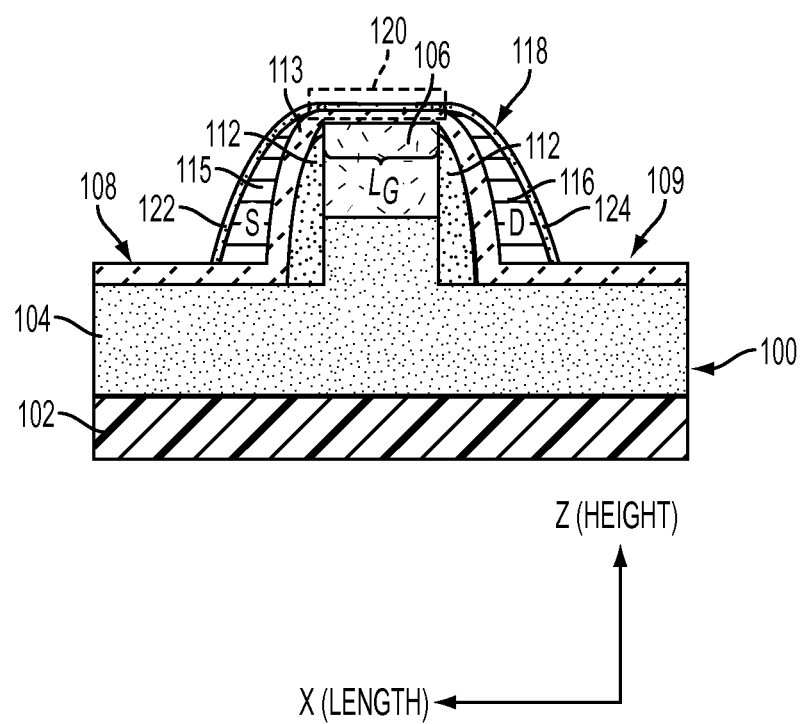
FIG. 9 illustrates the substrate of FIG. 8 following deposition of a carbon nanotube on outer surfaces of the metal contacts and an upper surface of the functionalized dielectric layer located between the metal contacts.

Referring now to FIG. 9, one or more carbon nanotubes 118 are deposited on outer surfaces of the metal contacts 115, 116 and an the upper surface of the functionalized dielectric layer 113 located between the metal contacts 115,116. The width of the carbon nanotube 118 is less than the width of the underlying metal contacts 115,116. Accordingly, a portion of the metal contacts 115, 116 may be exposed. The carbon nanotube 118 may be selectively placed on the exposed surface of the functionalized dielectric layer 113 using, for example, an ion-exchange placement procedure. The functionalized dielectric layer 113 anchors (i.e., supports) the carbon nanotube 118 against the outer surface of the source and drain metal contacts 115, 116. Although not illustrated, it is appreciated that an annealing process may be applied to the substrate 100 to enhance contact support between the carbon nanotubes 118, the metal contacts 115, 116, and the functionalized dielectric layer 113.

According to one exemplary embodiment, the functionalized dielectric layer 113 is a functional surface monolayer and the carbon nanotube 118 is a surfactant-wrapped carbon nanotube contained in aqueous solution. The functional surface monolayer may be formed from, for example, 4-(N-hydroxycarboxamido)-1-methylpyridinium iodide (NMPI) molecules, which are synthesized from commercially available methyl isonicotinate. The NMPI may be formed (e.g., coated) on regions of $HfO_2$, for example, to form the functionalized dielectric layer 113. The aqueous solution containing one or more carbon nanotubes 118 may be applied to the functionalized dielectric layer 113. Solubility of one or more carbon nanotubes 118 may be achieved using an anionic surfactant [sodium dodecyl sulfate (SDS)]. The anion of NMPI (i.e. iodide) is exchanged with the anionic surfactant wrapped around a carbon nanotube 118, leading to a strong coulombic attraction between the negatively charged surfactant and a positively charged monolayer. The strong electrostatic interaction between the monolayer and the carbon nanotube 118 leads to the placement of an individual carbon nanotube 118 with excellent selectivity. Accordingly, the carbon nanotube 118 may be electrostatically coupled to the exposed functionalized dielectric layer 113 such that the carbon nanotube 118 is supported against the outer surface of the source and drain metal contacts 115, 116.

The portion of the carbon nanotube 118 that contacts the functionalized dielectric layer 113 located at the gate stack 106 and between the source and drain metal 115, 116 forms a gate channel 120. The portion of the carbon nanotube 118 that contacts the source metal contact 115 forms a source 122, and the portion of the carbon nanotube 118 that contacts the drain metal contact 116 forms a drain 124. According to one exemplary embodiment, the source 122 and the drain 124 each extend along the Z-axis direction and have a greater total length than the length of the gate channel 120 (i.e., the gate length). For example, the total lengths of the source 122 and the drain 124 may be approximately 50 nm, while the total length of the gate channel 120 may be approximately 10 nm.

Figure 10:
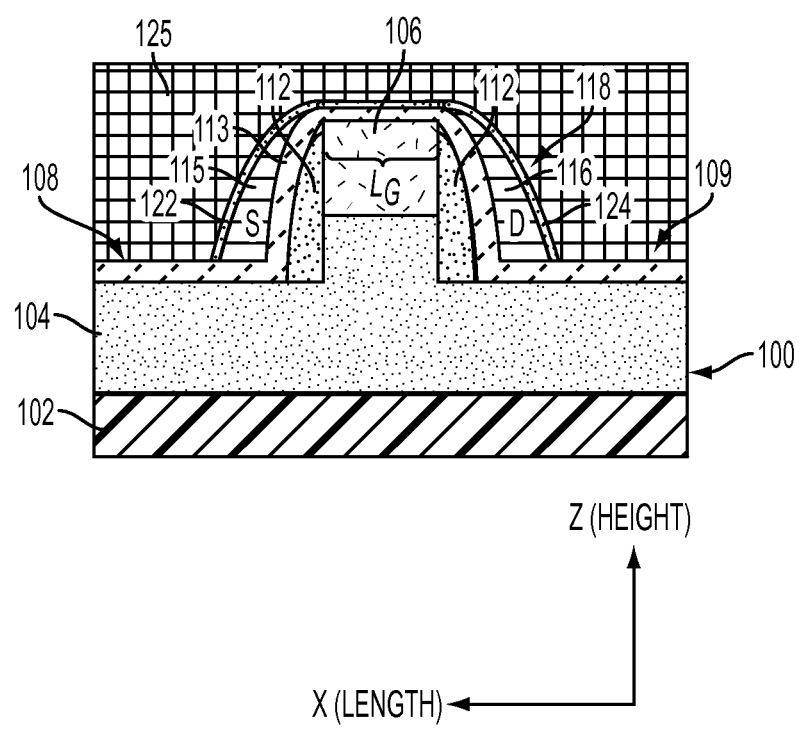
FIG. 10 illustrates the substrate of FIG. 9 following deposition of a litho block layer.
Figure 11:
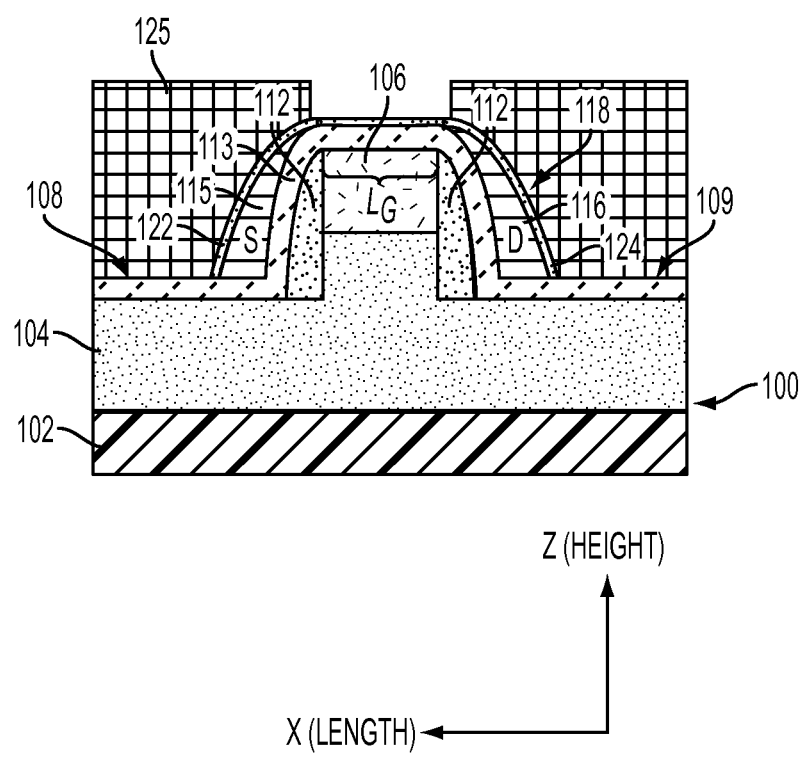
FIG. 11 illustrates the substrate of FIG. 10 following patterning of the litho block layer to expose a portion of the carbon nanotube and the functionalized dielectric layer located between the metal contacts.

Turning now to FIG. 10, a litho block layer 125 is formed on the substrate 100. The litho block layer 125 may be patterned such that the carbon nanotube 118 located at the gate stack 106 and between the metal contacts 115, 116 is exposed as illustrated in FIG. 11.

Figure 12:
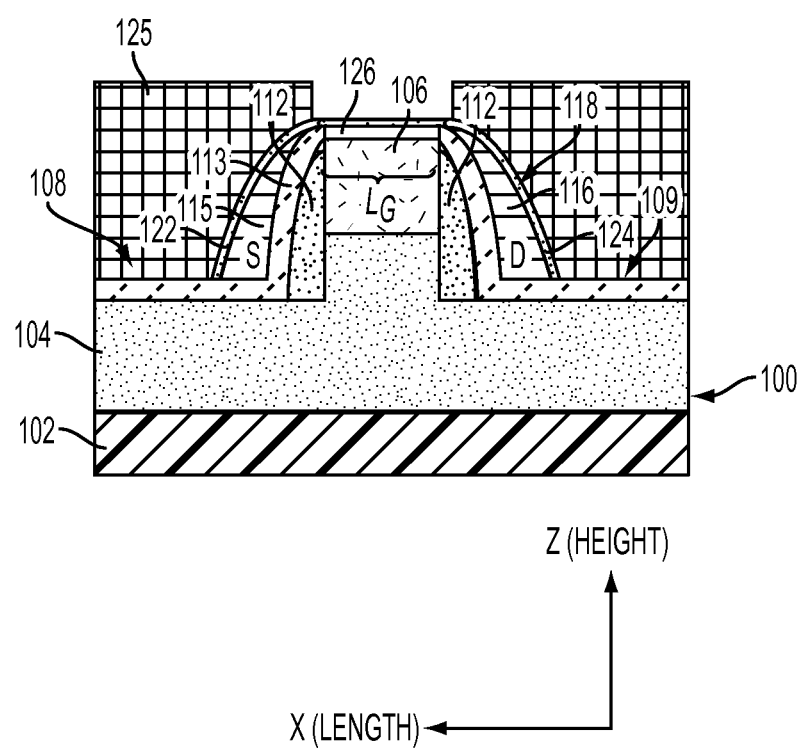
FIG. 12 illustrates the substrate of FIG. 11 after selectively removing the functionalized dielectric layer to form a suspended portion of the carbon nanotube and a void located between the suspended portion of the nanotube and the gate stack.

Referring to FIG. 12, a portion of the functionalized dielectric layer 113 interposed between the carbon nanotube 118 and the gate stack 106 may be selectively removed using, for example, a wet etch process. That is, the wet etching process reacts with the functionalized dielectric layer 113 without reacting with the carbon nanotube 118. Accordingly, the carbon nanotube 118 is suspended between the metal source contact 115 and the metal drain contact 116 such that a void 126 is formed between the carbon nanotube 118 and the gate stack 106.

Figure 13:
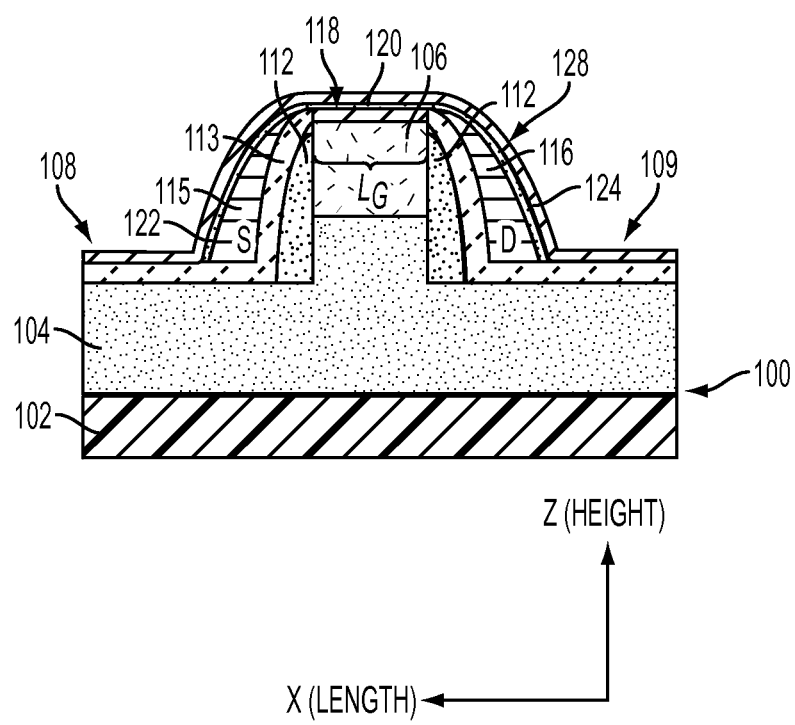
FIG. 13 illustrates the substrate of FIG. 12 after removing the remaining portion of the litho block layer and following deposition of a conformal gate dielectric layer.

Referring to FIG. 13, the remaining litho block layer 125 is removed and a conformal gate dielectric layer 128 is deposited on the substrate 100, which fills the void 126. Various methods may be used to deposit the gate dielectric block layer 128 including, but not limited to, ALD. The gate dielectric layer 128 may be formed from, for example, a high-k material. The high-k material may include, but is not limited to, hafnium silicate ($HfSiO_4$), zirconium silicate ($ZrSiO_4$), and zirconium dioxide ($ZrO_2$). The gate stack 106 and the gate dielectric layer 128 are configured to generate an electric field that selectively controls electrical current flow through the gate channel portion 120 as understood by those ordinarily skilled in the art. According to at least one embodiment, the width of the gate dielectric layer 128 is less than the width of the underlying gate stack 106. In this regard, a portion of the gate stack 106 may be exposed and/or accessed.

Figure 14:
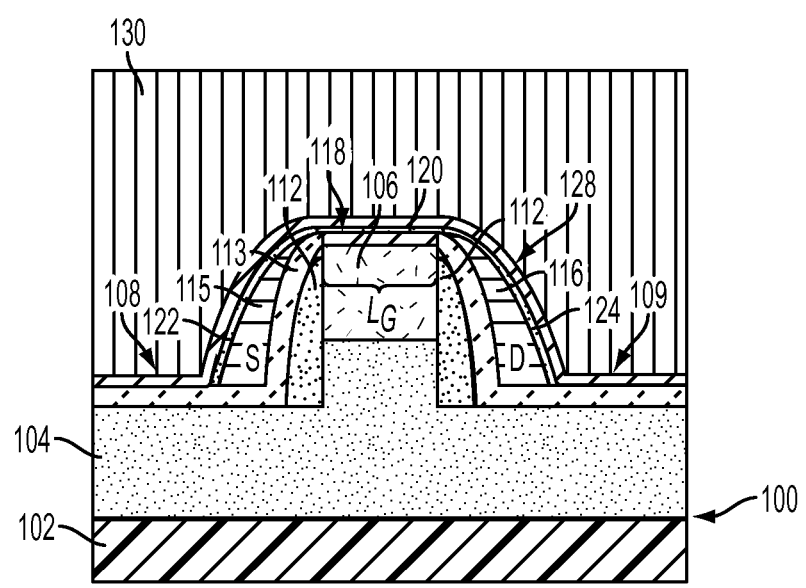
FIG. 14 illustrates the substrate of FIG. 13 following deposition of a block dielectric layer on the substrate that covers the gate dielectric layer.

Turning to FIG. 14, a block dielectric layer 130 is formed on the substrate 100 and covers an upper surface of the gate dielectric layer 128. The block dielectric layer may be formed from various materials including, but not limited to silicon dioxide ($SiO_2$), silicon nitride (SN), and silicon oxynitride (SiON). A chemical mechanical polishing/planarization (CMP) process may be applied to the block dielectric layer to polish and planarize the upper surface thereof.

Figure 15:
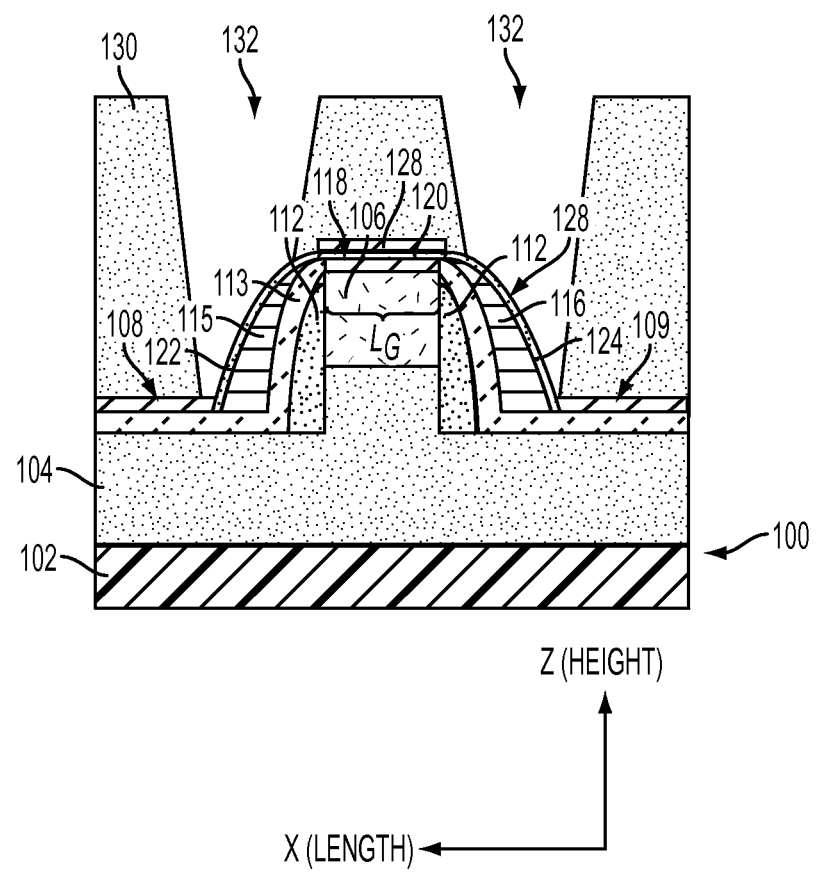
FIG. 15 illustrates the substrate of FIG. 14 after patterning the block dielectric layer to form source/drain voids and to remove the gate dielectric layer located in the voids to expose the carbon nanotube and the metal contacts.

Turning to FIG. 15, the block dielectric layer 130 may be patterned to form source/drain (S/D) voids 132. In addition, the gate dielectric layer 128 located in the voids 132 may be removed to expose the carbon nanotube and the metal contacts 115, 116. Portions of the gate dielectric layer 128 may be maintained at areas that remain covered by the block dielectric layer including, for example, the source region 108, the drain region 109, and the region surrounding the gate channel 120. For example, a first S/D void 132 may expose the source 122 and the source metal contact 115. A second S/D void 132 may expose the drain 124 and the drain metal contact 116. Various patterning/etching processes may be used to pattern the dielectric layer 130 as understood by those ordinarily skilled in the art.

Figure 16:
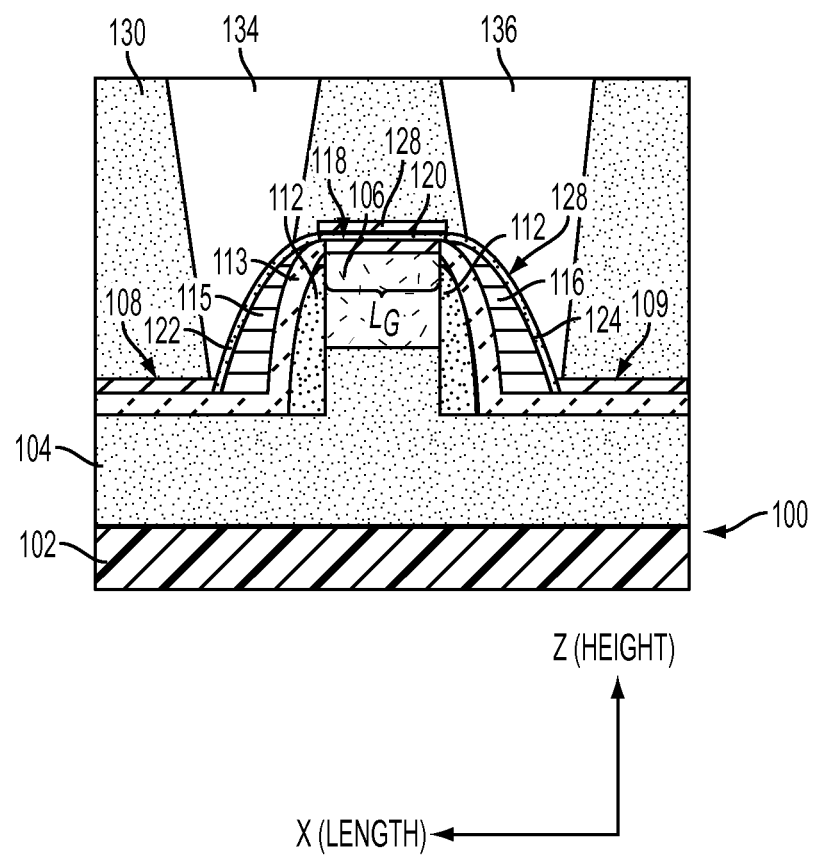
FIG. 16 illustrates the substrate of FIG. 15 following deposition of an electrically conductive material in the voids to form source and drain contact terminals.

Referring to FIG. 16, an electrically conductive material may be deposited to fill the voids 132. The electrically conductive material may be formed from metal including, but not limited to, tungsten (W), titanium nitride (TiN), and copper (Cu). The electrically conductive material forms a source contact terminal 134 and a drain contact terminal 136. The source contact terminal 134 is formed against an upper surface of the metal source contact 115. Accordingly, the source 122 of the carbon nanotube 118 is interposed between the source contact terminal 134 and the metal source contact 115. Similarly, the drain contact terminal 136 is formed against an upper surface of the metal drain contact 116. Accordingly, the drain 124 of the carbon nanotube 118 is interposed between the drain contact terminal 136 and the metal drain contact 116. In at least one embodiment, the contact length between the carbon nanotube 118 and at least one of the source contact 115 and the drain contact 116 is greater than a contact length between the carbon nanotube 118 and the gate dielectric layer 106. For example, the contact length between the carbon nanotube 118 and the source 122 and/or the drain 124 may be equal to or greater than approximately 50 nm.

Figure 17:
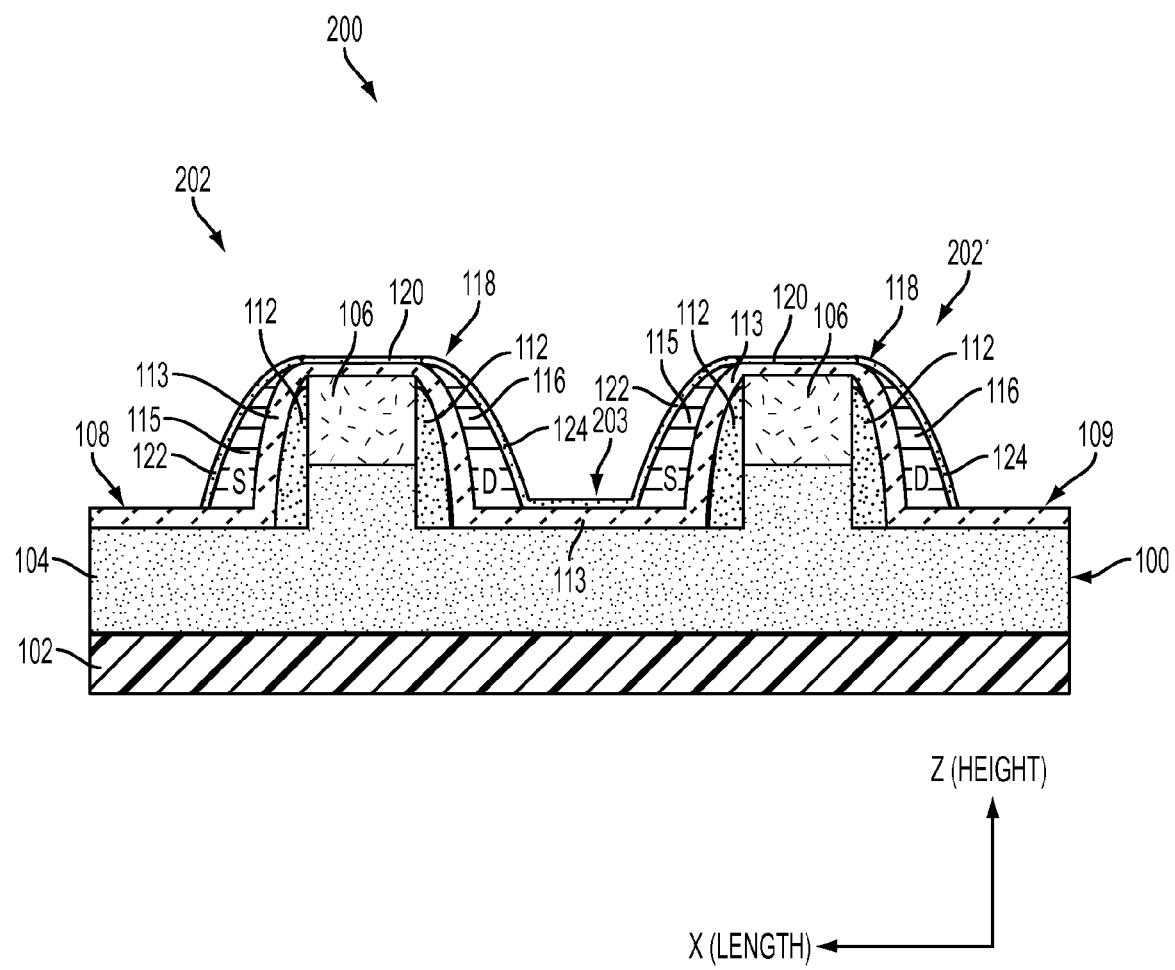
FIG. 17 is a cross-sectional view illustrating a multigate semiconductor device following deposition of carbon nanotubes according to another exemplary embodiment.

Referencing now FIG. 17, a semiconductor device 200 including multiple gate structures 202, 202' is illustrated according to another embodiment. As illustrated in FIG. 17, one or more carbon nanotubes 118 are formed on the first and second gate structures 202, 202' and extend into a valley 203 located between a metal drain contact 116 of the first gate structure 202 and a metal source contact 115 of the second gate structure 202'. The carbon nanotube 118 is formed against the metal contacts 115, 116 and is supported thereto by the exposed functionalized dielectric layer 113 as discussed in detail above. The multigate semiconductor device 200 may then be completed according to the process flow illustrated in FIGS. 10-15 as discussed in detail above.

Figure 18:
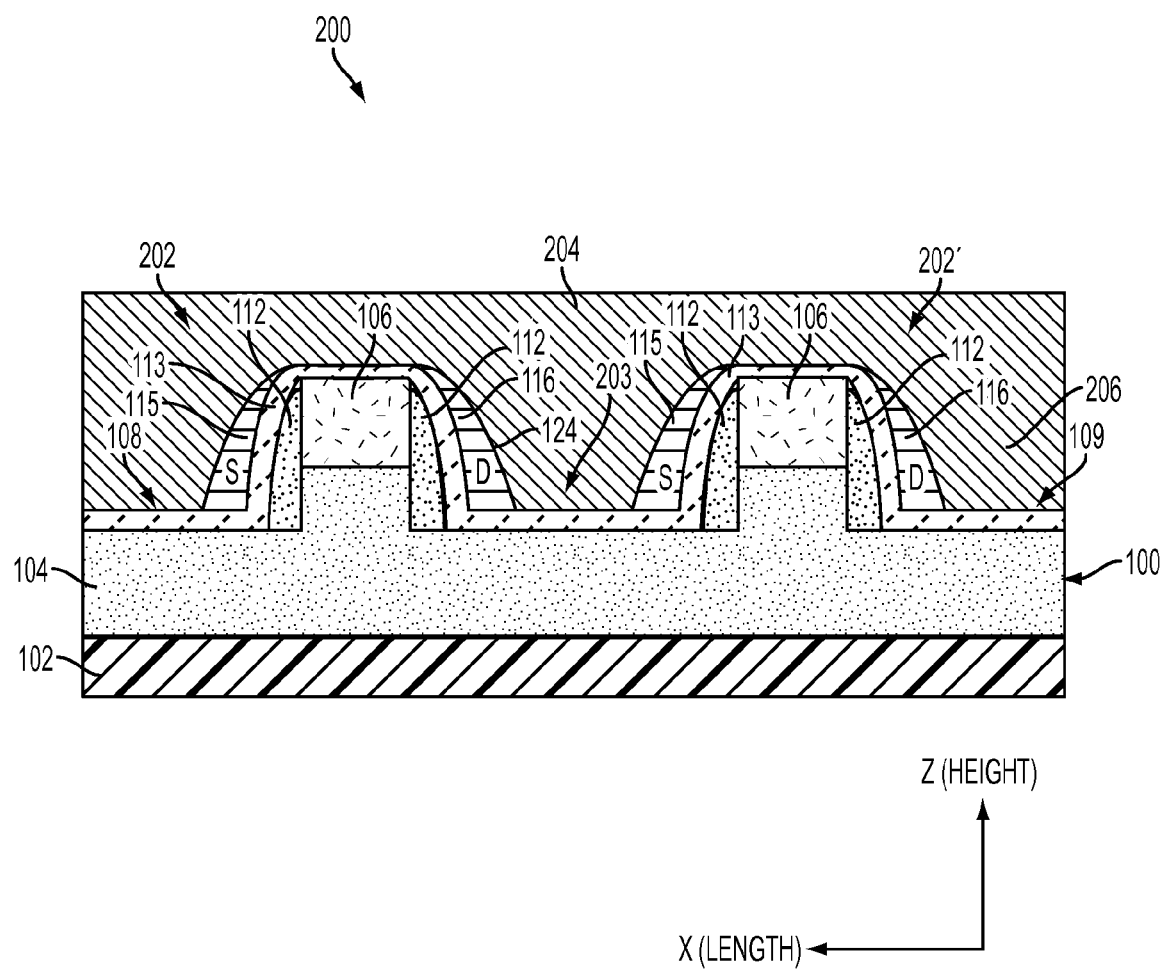
FIG. 18 is a cross-sectional view illustrating a multigate semiconductor device following deposition of a support dielectric block layer according to another exemplary embodiment.

Referring now to FIG. 18, a method of fabricating a multigate semiconductor device is illustrated according to another exemplary embodiment. After forming the multiple gate stacks 202, 202' including respective source/drain metal contacts 115, 116, a supporting dielectric layer 204 is formed on the substrate 100. The supporting dielectric layer 204 is deposited against the sidewalls of the source/drain metal contacts 115, 116 and covers the first and second gate structures 202, 202'. Although the supporting dielectric layer 204 is illustrated as a block layer, it is appreciated that the supporting dielectric layer 204 may be deposited as a conformal layer. The supporting dielectric layer 204 may be formed from, for example, $Al_2O_3$. Accordingly, the supporting dielectric layer may be selectively etched with respect to the functionalized dielectric layer 113 ($HfO_2$).

Figure 19:
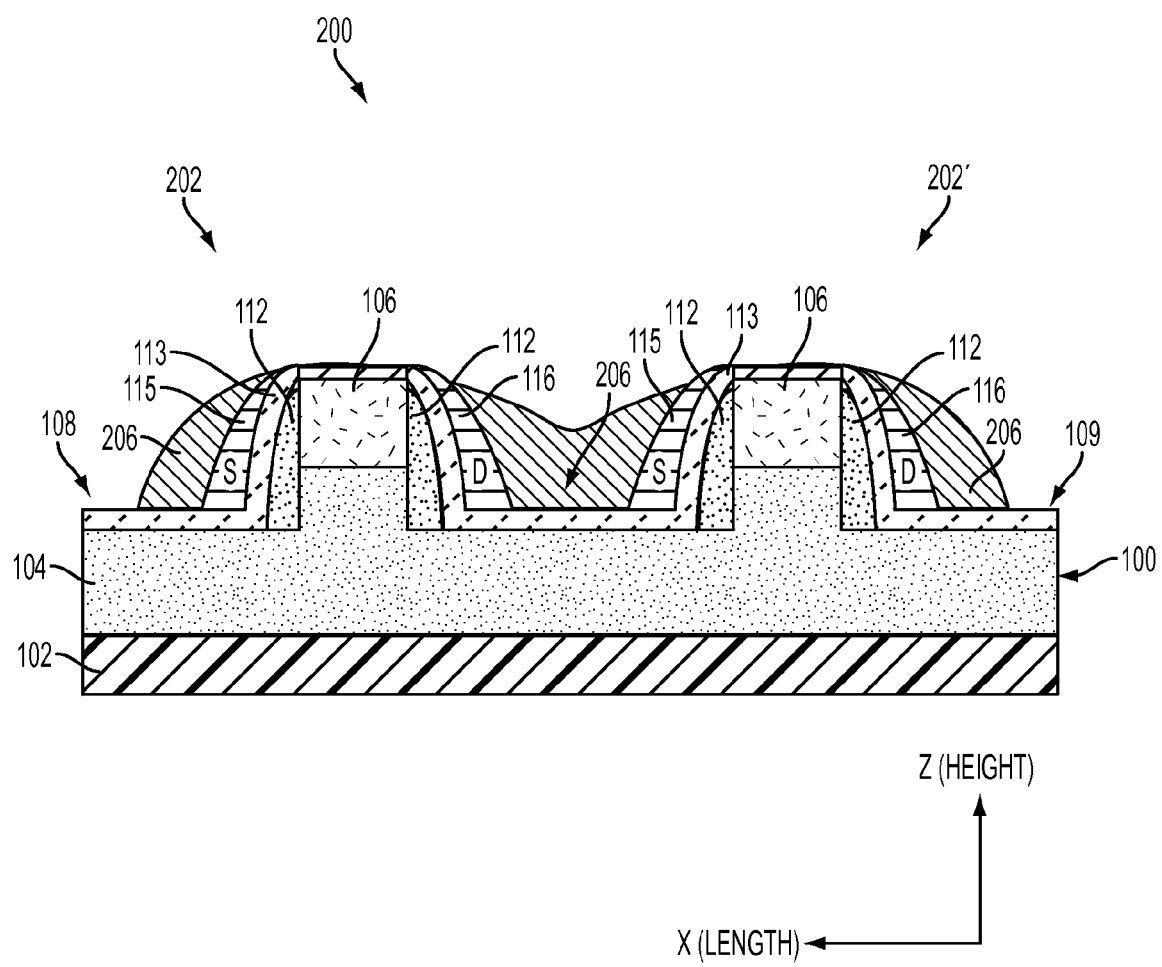
FIG. 19 illustrates the multigate semiconductor device of FIG. 18 following etching of the support dielectric block layer to form supporting regions against the outer surface of the metal contacts.

Turning to FIG. 19, the supporting dielectric layer 204 is etched using, for example, RIE. Accordingly, one or more supporting regions 206 are formed on sidewalls of the source/drain metal contacts 115,116. At least one supporting region 206 also fills the valley 203. The supporting regions 206 are configured to further support one or more carbon nanotubes deposited on the first and second gate stacks 202, 202'.

Figure 20:
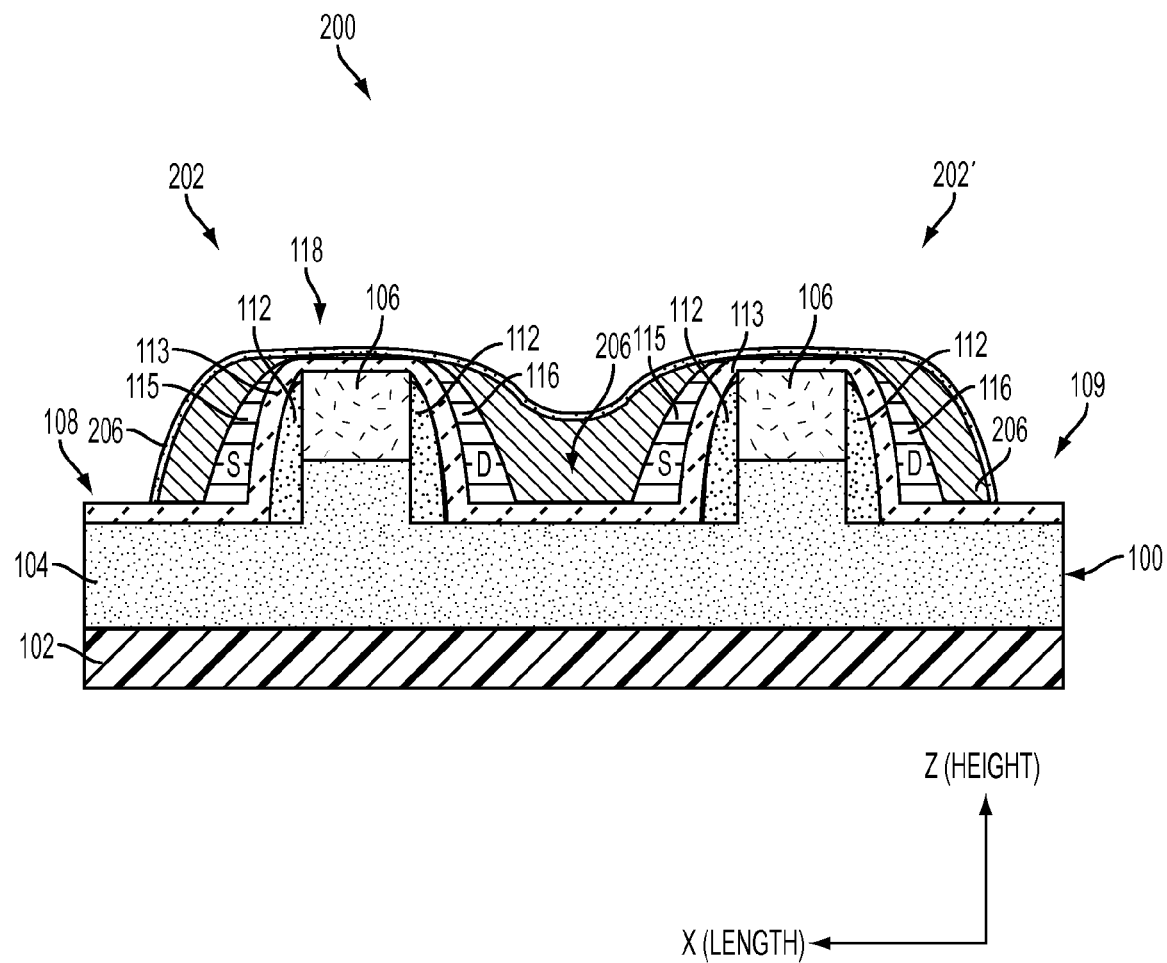
FIG. 20 illustrates the multigate semiconductor device of FIG. 19 following deposition of a carbon nanotube on the outer surface of the supporting regions and on the exposed surface of the functionalized dielectric layer located above the gate stack.

Referring now to FIG. 20, one or more carbon nanotubes 118 are formed on the first and second gate stacks 202, 202'. The carbon nanotube 118 is electrostatically coupled to the exposed functionalized dielectric layer 113 while being supported by the supporting regions 206. The supporting regions 206 may improve the successful rate of carbon nanotube 118 placement across the gate stacks 106 in light of the height of the source/drain metal contacts 115, 116.

Figure 21:
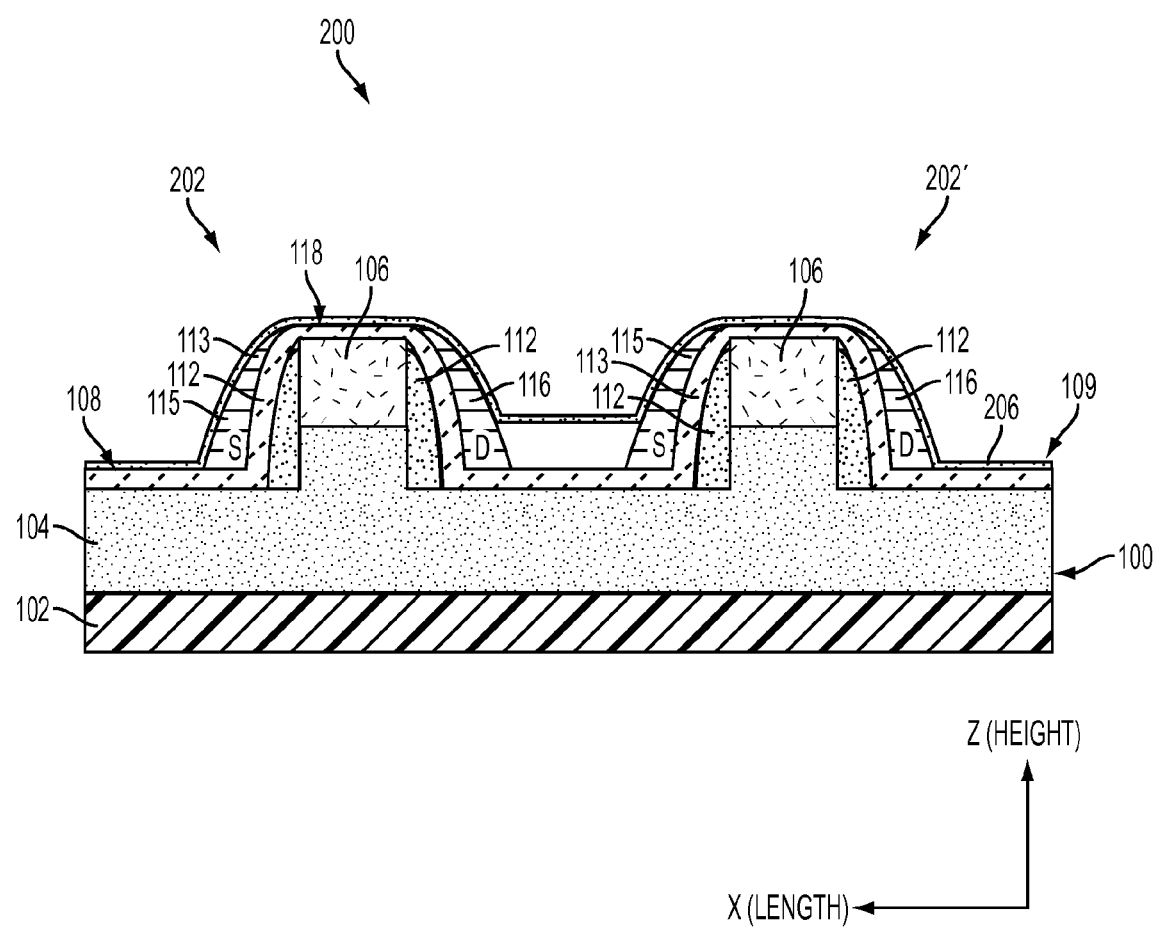
FIG. 21 illustrates the multigate semiconductor device of FIG. 20 following removal of the supporting regions to form a multigate carbon nanotube semiconductor device including metal contacts that extend vertically from the dielectric layer of the substrate toward an upper portion of the gate stack.

Referring to FIG. 21, a selective etching process, such as a wet etching process for example, is applied to the semiconductor device 200. The wet etching process may selectively etch the supporting regions 206 (e.g., the $Al_2O_3$ material) without reacting with the carbon nanotube 118. Accordingly, the supporting regions 206 may be removed and the carbon nanotube 118 may be formed directly against the metal contact regions 115, 116 and the exposed functionalized dielectric layer 113. The ends of the carbon nanotube 118 may extend further onto the exposed functionalized dielectric layer 113 after removing the supporting regions 206 to further anchor the carbon nanotube to the source/drain metal contacts 115, 116. According to at least one embodiment, a second portion of the carbon nanotube is suspended above a portion of the functionalized dielectric layer located at the valley 203 as illustrated in FIG. 21.

Figure 22:
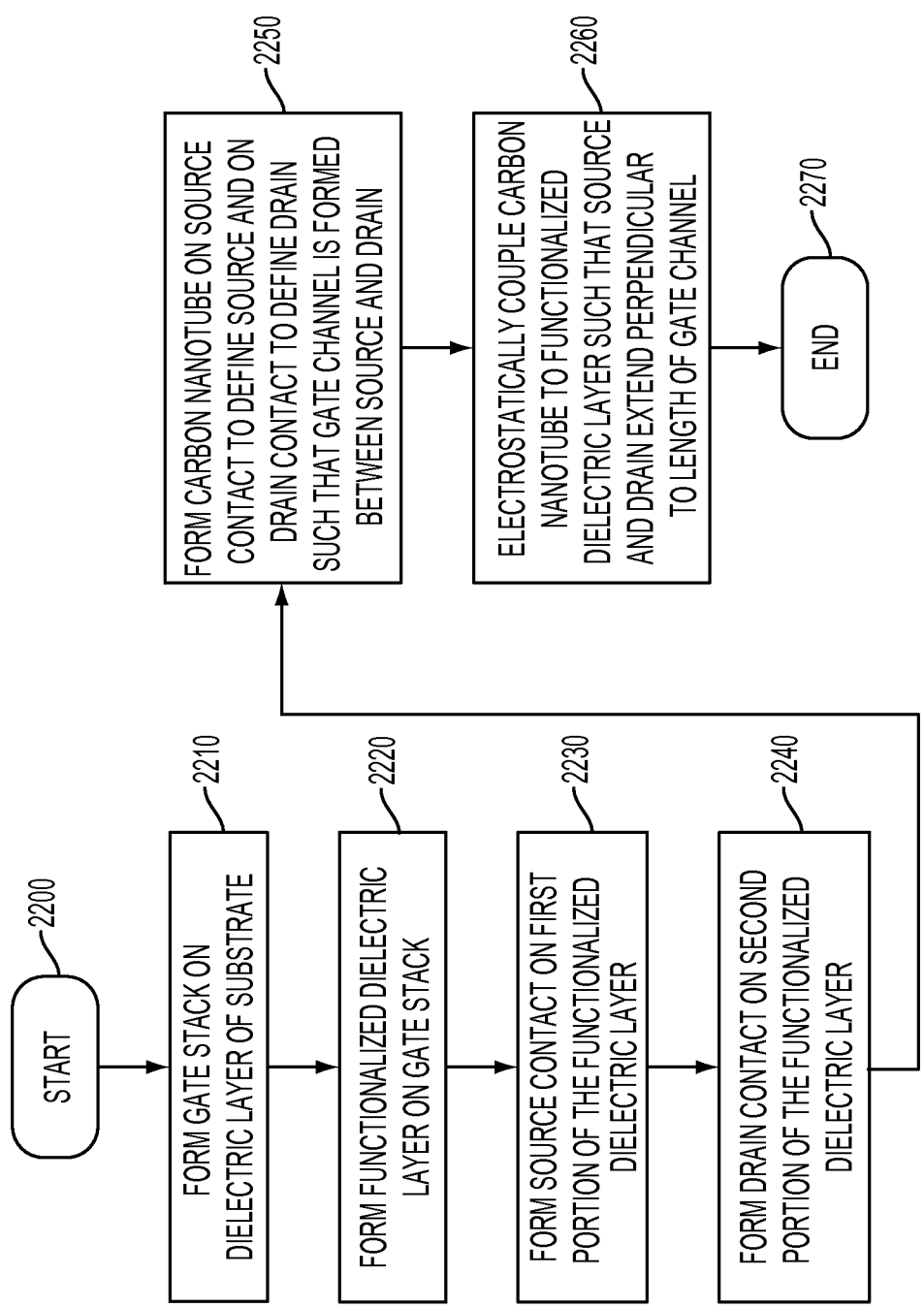
FIG. 22 is a flow diagram illustrating a method of fabricating a semiconductor device according to at least one exemplary embodiment.

Turning now to FIG. 22, a flow diagram illustrates a method of fabricating a semiconductor device according to at least one exemplary embodiment. The method begins at operation 2200, and a gate stack is formed on a dielectric layer of the substrate at operation 2210. At operation 2220, a functionalized dielectric layer is formed on the gate stack. At operation 2230, a source contact is formed on a first portion of the functionalized dielectric layer. At operation 2240, a drain contact is formed on a second portion of the functionalized dielectric layer. At operation 2250, a first portion of the carbon nanotube is formed on the source contact to define a source and a second portion of the carbon nanotube is formed on the drain contact to define a drain. A third portion of the carbon nanotube interposed between the first portion (i.e., the source) and the second portion (i.e., the drain) forms a gate channel having a gate length. At operation 2260, the carbon nanotube is electrostatically coupled to at least one portion of the functionalized dielectric layer such that the source and the drain extend in a second direction perpendicular to a gate length, and the method ends at operation 2270.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or operations described therein without departing from the spirit of the invention. For instance, the operations may be performed in a differing order or operations may be added, deleted or modified. All of these variations are considered a part of the claimed invention.

While various embodiments of have been described, it will be understood that those skilled in the art, both now and in the future, may make various modifications which fall within the scope of the claims which follow. These claims should be construed to maintain the proper protection for the invention first described.

What is claimed is:

1. A semiconductor device comprising:
    a substrate extending along a first direction to define a length and second direction perpendicular to the first direction to define a height, the substrate including a dielectric layer and at least one gate stack formed on the dielectric layer;
    a source contact formed adjacent to a first side of the gate stack and a drain contact formed adjacent to an opposing second side of the gate stack;
    a functionalized dielectric layer formed on the dielectric layer and interposed between each of the source and drain contacts and the gate stack; and
    a carbon nanotube formed on the source contact and the drain contact, the carbon nanotube including a first portion that contacts the source contact to form a source, a second portion that contacts the drain contact to form a drain, and a third portion interposed between the first and second portions to define a gate channel that extends along the first direction, the source and the drain extending along the second direction and having a greater length than a gate length of the gate channel,
    wherein at least one portion of the carbon nanotube is electrostatically coupled to at least one portion of the functionalized dielectric layer, and
    wherein a first end of the source is electrostatically coupled to a first portion of the functionalized dielectric layer that is formed against dielectric layer, and a second end of the source is electrostatically coupled to a second portion of the functionalized dielectric layer that is formed adjacent an upper portion of the gate stack.

2. The semiconductor device of claim 1, further comprising a gate dielectric layer interposed between the gate channel and the gate stack, wherein a contact area between the carbon nanotube and at least one of the source contact and the drain contact is greater than a contact area between the carbon nanotube and the gate dielectric layer.

3. The semiconductor device of claim 2, wherein the gate dielectric layer wraps completely around the gate channel.

4. The semiconductor device of claim 3, wherein the gate stack extends along the second direction to define a gate height, and the source and drain contacts extend along the second direction to define respective source and drain contact heights, the source and drain contact heights being greater than the gate height.

5. The semiconductor device of claim 4, wherein a first end of the drain is electrostatically coupled to a third portion of the functionalized dielectric layer that is formed against dielectric layer, and a second end of the drain is electrostatically coupled to a fourth portion of the functionalized dielectric layer that is formed adjacent an upper portion of the gate stack.

6. The semiconductor device of claim 5, wherein the functionalized dielectric layer includes 4-(N-hydroxycarboxamido)-1-methylpyridinium iodide (NMPI) molecules formed on a region comprising an oxide material selected from a group comprising hafnium oxide ($HfO_2$), aluminum oxide ($Al_2O_3$), and silicon nitride ($Si_3N_4$).

7. A method of fabricating a semiconductor device, comprising:
   forming at least one gate stack on a dielectric layer of a substrate, the substrate extending along a first direction to define a length and second direction perpendicular to the first direction to define a height;
   forming a functionalized dielectric layer on the gate stack;
   forming a source contact on a first portion of the functionalized dielectric layer located at a first side of the gate stack and forming a drain contact on a second portion of the functionalized dielectric layer located at an opposing second side of the gate stack;
   forming a carbon nanotube on the source contact to define a source, and on the drain contact to define a drain such that a gate channel is interposed between the source and the drain and extends along the first direction to define a gate length; and
   electrostatically coupling at least one portion of the carbon nanotube on the functionalized dielectric layer such that the source and the drain extend in the second direction perpendicular to a gate length.

8. The method of claim 7, wherein a contact area between the carbon nanotube and at least one of the source contact and the drain contact is greater than an area of the gate channel.

9. The method of claim 8, wherein a total height of the source and drain is greater than a total height of the gate stack.

10. The method of claim 9, wherein the forming the carbon nanotube includes suspending the carbon nanotube to define a void between the carbon nanotube and the gate stack.

11. The method of claim 10, further comprising forming a gate dielectric layer on the carbon nanotube, the gate dielectric layer filling the void.

12. The method of claim 11, further comprising selectively removing the gate dielectric layer from portions of the carbon nanotube that contact the source contact and the drain contact such that a portion of the gate dielectric layer remains wrapped around the gate channel.

13. The method of claim 12, further comprising forming an electrically conductive source contact terminal on the portions of the carbon nanotube that contact the source contact and forming an electrically conductive source contact terminal on the portions of the carbon nanotube that contact the drain contact.

14. The method of claim 7, wherein forming at least one gate stack includes forming a first gate stack and a second gate stack, the first and second gate stacks each having respective source and drain contacts and each being separated from one another by a valley that exposes a valley portion of the functionalized dielectric layer.

15. The method of claim 14, further comprising forming a supporting dielectric layer against the source and drain contacts of the first and second gate stacks, the supporting dielectric layer filling the valley between.

16. The method of claim 15, wherein the forming a carbon nanotube on the source and drain contacts comprises:
   forming the carbon nanotube on the supporting dielectric layer such that carbon nanotube is supported at the valley; and
   selectively removing the supporting dielectric layer such that the at least one portion of the carbon nanotube is electrostatically coupled to at least one portion of the functionalized dielectric layer, while a second portion of the carbon nanotube is suspended above the valley portion of the functionalized dielectric layer.

17. The method of claim 13, wherein the forming the functionalized dielectric layer further comprises:
   forming an on at least one functionalized region of the functionalized dielectric layer, the oxide selected from a group comprising hafnium oxide ($HfO_2$), aluminum oxide ($Al_2O_3$), and silicon nitride ($Si_3N_4$); and
   forming 4-(N-hydroxycarboxamido)-1-methylpyridinium iodide (NMPI) molecules on the at least one functionalized region.

* * * * *